(12) United States Patent
Pinnow

(10) Patent No.: US 7,772,614 B2
(45) Date of Patent: Aug. 10, 2010

(54) SOLID ELECTROLYTE MEMORY ELEMENT AND METHOD FOR FABRICATING SUCH A MEMORY ELEMENT

(75) Inventor: Cay-Uwe Pinnow, Munich (DE)

(73) Assignee: Qimonda AG, Munich (DE)

( * ) Notice: Subject to any disclaimer, the term of this patent is extended or adjusted under 35 U.S.C. 154(b) by 951 days.

(21) Appl. No.: 11/377,633

(22) Filed: Mar. 16, 2006

(65) Prior Publication Data

US 2006/0221555 A1    Oct. 5, 2006

(30) Foreign Application Priority Data

Mar. 16, 2005    (DE) .................. 10 2005 012 047

(51) Int. Cl.
*H01L 21/00* (2006.01)
(52) U.S. Cl. .................. 257/154; 257/E31.029; 438/95
(58) Field of Classification Search .................. 361/524, 361/525; 29/25.03; 438/95
See application file for complete search history.

(56) References Cited

U.S. PATENT DOCUMENTS

| | | | |
|---|---|---|---|
| 4,108,743 A * | 8/1978 | Minck .................. 205/367 |
| 4,550,074 A | 10/1985 | Tzinis et al. |
| 4,820,394 A | 4/1989 | Young et al. |
| 6,189,582 B1 * | 2/2001 | Reinberg et al. .................. 438/239 |
| 6,348,365 B1 * | 2/2002 | Moore et al. .................. 438/130 |
| 6,653,193 B2 * | 11/2003 | Gilton .................. 438/286 |
| 6,709,887 B2 * | 3/2004 | Moore et al. .................. 438/95 |
| 6,727,192 B2 * | 4/2004 | Moore et al. .................. 438/795 |
| 6,730,547 B2 * | 5/2004 | Li et al. .................. 438/128 |
| 6,800,504 B2 * | 10/2004 | Li et al. .................. 438/102 |
| 6,858,465 B2 * | 2/2005 | Li et al. .................. 438/95 |
| 6,881,623 B2 * | 4/2005 | Campbell et al. .................. 438/257 |
| 6,890,363 B1 * | 5/2005 | Sakai et al. .................. 29/25.03 |
| 6,955,940 B2 * | 10/2005 | Campbell et al. .................. 438/95 |
| 6,974,965 B2 * | 12/2005 | Li .................. 257/2 |
| 7,303,939 B2 * | 12/2007 | Klein .................. 438/95 |
| 7,433,655 B2 * | 10/2008 | Jacobs et al. .................. 455/90.3 |
| 7,459,764 B2 * | 12/2008 | Moore et al. .................. 257/530 |
| 7,528,401 B2 * | 5/2009 | Li .................. 257/2 |
| 2002/0168852 A1 * | 11/2002 | Harshfield et al. .................. 438/650 |
| 2003/0052330 A1 * | 3/2003 | Klein .................. 257/154 |
| 2003/0215978 A1 * | 11/2003 | Maimon et al. .................. 438/95 |
| 2004/0238918 A1 * | 12/2004 | Moore et al. .................. 257/528 |
| 2005/0016839 A1 * | 1/2005 | Horne et al. .................. 204/242 |
| 2005/0127524 A1 | 6/2005 | Sakamoto et al. |
| 2005/0201143 A1 * | 9/2005 | Pinnow et al. .................. 365/149 |
| 2005/0243596 A1 * | 11/2005 | Symanczyk .................. 365/153 |
| 2006/0001000 A1 * | 1/2006 | Pinnow et al. .................. 252/62.2 |
| 2006/0221555 A1 * | 10/2006 | Pinnow .................. 361/525 |

FOREIGN PATENT DOCUMENTS

DE    19505818 A1    9/1995
KR    1020040111563    12/2004

OTHER PUBLICATIONS

Translation of KIPO—Office Action for Application No. 10-2006-0024472, Dated Nov. 22, 2007.

* cited by examiner

*Primary Examiner*—Leonardo Andújar
*Assistant Examiner*—William Harriston
(74) *Attorney, Agent, or Firm*—Patterson & Sheridan, L.L.P.

(57) ABSTRACT

A solid electrolyte memory element comprising an inert cathode electrode, a reactive anode electrode and a solid electrolyte layer disposed between the inert cathode electrode and the reactive anode electrode, wherein the solid electrolyte layer comprises a solid electrolyte matrix having defect sites.

16 Claims, 2 Drawing Sheets

SOLID ELECTROLYTE MEMORY ELEMENT AND METHOD FOR FABRICATING SUCH A MEMORY ELEMENT

CROSS-REFERENCE TO RELATED APPLICATIONS

This application claims foreign priority benefits under 35 U.S.C. §119 to co-pending German patent application number DE 10 2005 012 047.4, filed 16 Mar. 2005. This related patent application is herein incorporated by reference in its entirety.

BACKGROUND OF THE INVENTION

1. Field of the Invention

The invention relates to a solid electrolyte memory element and a method for fabricating such a memory element which comprises an inert cathode electrode, a reactive anode electrode and a solid electrolyte layer disposed in between the electrodes.

2. Description of the Related Art

The development of semiconductor memory technology is essentially driven by the requirement to increase the performance of the semiconductor memories whilst at the same time reducing the feature sizes. Further miniaturization of the semiconductor memory concepts based on storage capacitors is difficult, however, in particular owing to the large quantity of charge that is required for writing to and reading from the storage capacitors and that leads to a high current demand. Therefore, thought is increasingly being given to new cell concepts that are distinguished by a significantly smaller quantity of charge for the writing and reading operations. Semiconductor memories comprising resistance memory elements provide such promising switching architecture. The resistance memory element is distinguished by two different conductivity states which are in each case assigned a memory state, that is to say "logic 0" or "logic 1". Generally, to detect the memory state of the resistance memory element, the current flowing via the resistance memory element at an applied read voltage is evaluated.

One possible memory concept with a resistance memory element is the so-called CBRAM (conductive bridging random access memory) cell, in which the resistance memory element comprises an inert cathode electrode, a reactive anode electrode and an ionically conductive carrier material. In this case, the ionically conductive carrier material is generally a solid electrolyte comprising a chalcogenide compound or an oxide. Metal atoms or ions can be incorporated in such a vitreous solid electrolyte in order to obtain an ionic conductor having a high ion mobility at room temperature. Preferably, silver or copper is used as the reactive anode electrode for the resistive element, and tungsten, titanium nitride or doped polysilicon is used for the inert cathode electrode.

The function of the CBRAM cell utilizes the effect whereby metallic ions can be diffused (or infused) into the ionically conductive solid electrolyte material or can be removed from the solid electrolyte material in a controlled manner by application of bipolar voltage pulses. The CBRAM cell can thus switch back and forth between a high-resistance state and a low-resistance state, the different resistance values in each case being assigned a logic state. In this case, the metallic ions introduced into the solid electrolyte layer in a variable manner generally originate from the reactive anode electrode. During the writing operation, that is to say when the metallic ions are diffused into the solid electrolyte material, upon application of a positive write voltage, anode material is oxidized and is dissolved in the solid electrolyte. In this case, the ion diffusion can be controlled by the duration, the intensity and the polarity of the impressed electrical voltage. As soon as a sufficient number of metallic ions have diffused into the solid electrolyte material, a low-resistance metallic or semiconducting bridge forms between the anode electrode and the cathode electrode, as a result of which the electrical resistance of the CBRAM cell decreases greatly.

During the erasure operation, by applying a negative erase voltage, the metallic ions that have diffused into the solid electrolyte material are attracted by the anode electrode, where the metallic ions then deposit again after reduction. This interrupts the low-resistance metallic or semiconducting bridge between the anode electrode and the cathode electrode, which has the effect that the resistance of the CBRAM cell increases greatly. By means of the writing and erasure operations, the CBRAM cell can thus be switched back and forth between the low-resistance state and the high-resistance state which in each case represent a respective logic state. During the read-out of the CBRAM cell, generally the procedure is such that a capacitance is charged or discharged via the CBRAM cell and the electrical potential of the capacitance is then assessed after a predetermined point in time in order thus to determine the logic state of the CBRAM cell.

An objective in memory cell development is high switching speeds for the writing and erasure operations. Thus, in conventional DRAM (dynamic random access memory) and SRAM (static random access memory) cells fabricated using silicon CMOS technology, switching speeds of less than 25 ns are achieved during programming. In the case of CBRAM cells, by contrast, if a method suitable for mass production is used for fabricating the solid electrolyte layer, only significantly lower switching speeds are achieved. This is because the layer producing methods that are usually used in silicon technology, such as, in particular, sputtering methods, chemical vapor deposition (CVD) methods or atomic layer deposition (ALD) methods, produce highly dense layer structures which prevent a rapid ion migration under the influence of an external electric field. Thus, during the application of layers by sputtering, typically layers are produced which, although they are at least partly amorphous, nonetheless have a high-density matrix. In the case of CBRAM cells, when a sputtering process is used for forming the solid electrolyte layer, only switching speeds of approximately 100 ns can be achieved during the writing operation and only switching speeds of 100 μs during the erasure operation. This also holds true when a CVD method or ALD method is used instead of a sputtering method. On account of the high temperatures used in these methods, e.g., 200° C. to 800° C. in the CVD method and 200° C. to 500° C. in the ALD method, nanocrystalline high-density layers form which have only low ion mobility and thus essentially prevent a rapid diffusion of metallic ions during the programming operation and erasure operation of CBRAM cells.

In order to enable faster switching, therefore, methods for fabricating porous solid electrolyte layers have been proposed. Thus, M. N. Kozicki et al. "Can Solid State Electrochemistry Eliminate the Memory Scaling Quandary?" in: IEEE Si Nanoelectronics Workshop, 2002 describes one possibility for fabricating CBRAM cells having switching speeds of approximately 25 ns with thermally vapor-deposited chalcogenide layers as solid electrolyte and additionally vapor-deposited ion donor material. The method of thermal vapor deposition of the solid electrolyte layers that is used by Kozicki et al. is not suitable for mass production, however, since it enables only poor reproducibility and low layer homogeneity in the case of large semiconductor substrates, e.g., 200 mm or 300 mm silicon wafers.

Although the switching speed in CBRAM cells can also be increased by increasing the pulse amplitudes during the writing and erasure operations, the applied electric field strength must not lead to high current densities in the cell that are harmful for the CBRAM cell. The repeated application of high electric fields furthermore intensifies the degradation of the solid electrolyte material.

Furthermore, in the case of low ion mobility, in particular during the erasure operation, the electric fields have to be applied with a long pulse duration in order to achieve a complete resolution of the electrical connection formed by means of the metallic ions between anode electrode and cathode electrode by the metallic ions being transported back to the anode electrode. However, long erase pulses lead to asymmetrical operation of the CBRAM cell or necessitate operating a memory cell array comprising CBRAM cells massively in parallel in order to realize a sufficiently high data rate during erasure.

Therefore, there is a need to provide an improved method for fabricating a solid electrolyte memory element and an improved solid electrolyte memory element which enable high switching speeds under mass production conditions.

SUMMARY OF THE INVENTION

The embodiments of the present invention provide a method for fabricating a solid electrolyte memory element and a solid electrolyte memory element.

In accordance with a first embodiment of the invention, a method for fabricating a solid electrolyte memory element comprises providing a first electrode, coating the first electrode with a solid electrolyte layer with targeted defect formation in the solid electrolyte matrix, and applying a second electrode on the solid electrolyte layer.

In accordance with a second embodiment of the invention, a method for fabricating a solid electrolyte memory element comprises providing a first electrode, coating the first electrode with a solid electrolyte layer with targeted defect formation in the at least partly crystalline solid electrolyte material, and applying a second electrode on the solid electrolyte layer.

In accordance with a third embodiment of the invention, a solid electrolyte memory element has an inert cathode electrode, a reactive anode electrode and a solid electrolyte layer disposed in between the inert cathode electrode and the reactive anode electrode, wherein the solid electrolyte layer has a solid electrolyte matrix with defect sites.

In accordance with a fourth embodiment of the invention, a solid electrolyte memory element has an inert cathode electrode, a reactive anode electrode and a solid electrolyte layer disposed in between the inert cathode electrode and the reactive anode electrode, wherein the solid electrolyte layer has an at least partly crystalline solid electrolyte matrix with defect sites.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
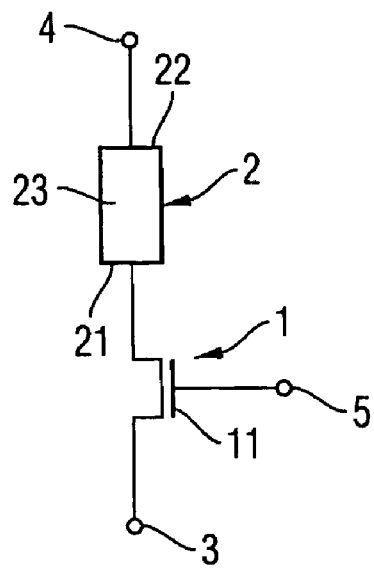
FIG. 1 schematically shows an exemplary construction of a CBRAM cell with a solid electrolyte memory element in circuit symbol notation according to one embodiment of the invention.

FIG. 1 schematically shows in circuit symbol notation a CBRAM (conductive bridging RAM) cell, comprising a drive transistor 1 and a solid electrolyte memory element 2. The drive transistor 1 (also referred to as selection transistor) and the solid electrolyte memory element 2 are in this case connected in series between a bit line 3 and a ground terminal 4, the control terminal 11 of the drive transistor 1 being connected to a word line 5 in order to open or close the drive transistor 1 with the aid of an activation signal on the word line 5. In this case, the solid electrolyte memory element is a resistance memory element (also known as programmable metallization cell or PMC element) comprising a reactive anode electrode 21 and an inert cathode electrode 22, between which a storage layer 23 made of ionically conductive solid electrolyte material is provided.

Through application of a positive voltage between the reactive anode electrode 21 and the inert cathode electrode 22, an electrochemical oxidation process takes place at the reactive anode electrode, during which the metallic anode material is oxidized and is dissolved in the solid electrolyte layer 23. In this case, the ion diffusion of the anode material in the solid electrolyte layer 23 can be controlled by the duration and the amplitude of the impressed electrical voltage. As soon as a sufficient number of metal ions from the anode electrode have diffused into the solid electrolyte material, a metallic or semiconducting bridge forms between the anode electrode 21 and the cathode electrode 22, as a result of which the electrical resistance of the memory element 2 decreases greatly.

This conductive path can be withdrawn again through application of a negative voltage between the anode electrode 21 and the cathode electrode 22, the ions (released into the solid electrolyte from the anode electrode 21) moving toward the anode electrode 21 and depositing there again after reduction. As a consequence of this, the resistance of the memory element increases greatly. The solid electrolyte memory cell can thus be switched back and forth between a high-resistance state and a low-resistance state by means of electrical pulses that are applied alternately between the anode electrode 21 and cathode electrode 22, it being possible for the different resistance values each to be assigned a logic state.

The drive transistor 1 of the CBRAM cell is generally a field effect transistor via which the resistive element 2 can be connected to the bit line 3. In this case, the drive transistor 1 is switched on and off via the assigned word line 5 in order to program and to read the solid electrolyte memory element 2 by application of the corresponding voltages. In this case, the CBRAM cell is read by measuring the resistance of the solid electrolyte memory element 2. This electrical resistance value is generally compared with a reference quantity in order to assess the logic state of the solid electrolyte memory element and hence of the CBRAM cell.

As solid electrolyte material for use in resistive resistance memory elements, use is made primarily of chalcogenide compounds with elements of the sixth main group such as selenium, sulfur and tellurium and in this case, in particular, compounds having semiconductor properties which can readily be processed with silicon in the context of memory cell fabrication. Preferred chalcogenide compounds in this case are $Ge_xSe_{1-x}$, $Ge_xS_{1-x}$, CuS and CuSe. Besides chalcogenide compounds, however, oxide compounds such as $WO_x$ are also often used as solid electrolyte material. Preferably, silver or copper is used as material for the reactive anode electrode. The cathode electrode generally comprises tungsten, titanium nitride or doped polysilicon.

Compared with conventional DRAM and SRAM cell concepts, CBRAM cells are distinguished by a significantly smaller quantity of charge for carrying out the writing and reading operations and hence a reduced current demand. Furthermore, CBRAM cells and in this case, in particular, the solid electrolyte memory elements can be given very small dimensions, which enables a high degree of miniaturization of the memory cell.

One difficulty in the case of CBRAM cells and, in particular, in the case of the solid electrolyte memory elements consists in achieving switching speeds for writing and erasure that are comparable with conventional DRAM or SRAM cells. This applies in particular to solid electrolyte layers fabricated with the aid of the layer producing methods known from silicon technology, such as sputtering, CVD methods or ALD methods. These known layer producing methods that are suitable for mass production lead to a high-density layer construction and hence greatly reduced ion mobility in the solid electrolyte matrix, which in turn entails long switching times during the programming of the solid electrolyte memory element. This is because the mobility of the metallic ions in the solid electrolyte matrix is the crucial parameter for establishing and removing the conductive connection between the anode electrode and the cathode electrode via the solid electrolyte layer during writing or during erasure. Although there is the possibility of accelerating the switching operation by applying high electric fields during the writing and erasure processes, high field strengths nonetheless lead to a degradation of the solid electrolyte material and hence to a destruction of the cell.

According to one embodiment of the invention, in order to achieve a high mobility of the metallic ions in the solid electrolyte matrix and at the same time to be able to use the layer producing methods that are known from silicon technology and are suitable for mass production, the solid electrolyte layer is formed with targeted defect formation in the at least partly crystalline solid electrolyte matrix. By means of this special process implementation during the solid electrolyte layer production in the context of the CBRAM cell fabrication, the dense and low-defect solid electrolyte matrix such as is produced in the context of the known layer producing methods that are suitable for mass production, such as the sputtering process, the CVD method or the ALD method, is additionally provided with defect sites such as vacancies or dislocations, as a result of which the ion mobility is significantly increased, and switching speeds for writing to and erasing the CBRAM cells in the nanoseconds range can thus be achieved.

Figure 2A:
FIGS. 2A-2G schematically show one embodiment for the fabrication of a solid electrolyte memory element according to the invention.

FIGS. 2A-2G show one exemplary process sequence for forming a solid electrolyte memory element according to one embodiment of the invention. In this case, the individual figures each schematically show a cross section through the structure after different successive process steps. The starting point, as shown in FIG. 2A, is a semiconductor wafer, such as a silicon wafer 200. Various components as are required when forming an integrated circuit with CBRAM cells may already be provided in said semiconductor wafer 200.

Figure 2B:

A first electrode layer 210, e.g., the cathode electrode, is then applied on the semiconductor wafer 200, as shown in FIG. 2B. The layer is generally produced by depositing a corresponding metallization, e.g., a tungsten, titanium nitride or doped polysilicon layer.

Figure 2C:
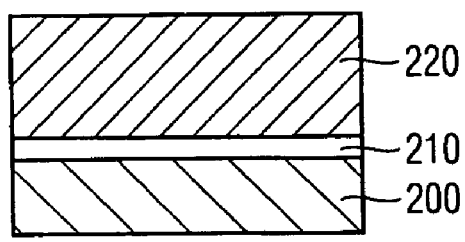

A dielectric layer 220, e.g., silicon dioxide or silicon nitride, is applied on the first electrode layer 210 by means of a known layer producing method. In one embodiment, the layer thickness of the dielectric layer may be between 50 nm and 100 nm. A cross section through the structure after this process step is shown in FIG. 2C.

With the aid of photolithography technology, the region for forming the solid electrolyte block is then defined on the dielectric layer 220 and the dielectric layer is etched back in the corresponding region to the first electrode layer 210.

Figure 2D:
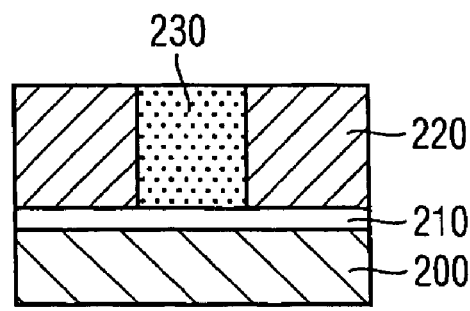

Afterward, as shown in FIG. 2D, solid electrolyte material 230 is introduced in the etched-free region of the dielectric layer 220. The solid electrolyte material, which may comprise a chalcogenide or oxide compound, may be produced by one of the layer producing methods that are known from silicon technology and are suitable for mass production, such as the CVD method, the ALD method or the sputtering process.

As an alternative, the first electrode layer, solid electrolyte layer and the second electrode layer can also be deposited one after another and be patterned by a subsequent etching process, that is to say without a dielectric having to be deposited and etched. This variant in this context may provide certain advantages in actual production of memory devices. FIGS. 2A to 2G show only schematic test structures for illustrative purposes.

The CVD method is based on the principle that selected gases are conducted over the heated semiconductor wafer, the surface temperature of which lies between 200° and 800°. The process gases then react on the hot surface, the desired layer depositing as reaction product. In the ALD deposition method, the solid electrolyte material is grown in the etched-free trench as monoatomic layers at a surface temperature of the semiconductor wafer of between 200° and 500°. The solid electrolyte layers fabricated in the CVD or ALD method are generally nanocrystalline with a very densely packed matrix having low ion mobility. This also applies to a solid electrolyte layer fabricated with the aid of the sputtering technique, in the case of which layer, although the layer structure is generally amorphous, it is nonetheless likewise packed very densely, which leads to low ion mobility.

In order to increase the ion mobility, therefore, an after-treatment of the solid electrolyte layer 230 for the formation of defects, that is to say, vacancies and dislocations, in the solid electrolyte matrix is carried out according to one embodiment of the invention. This may be effected by particle irradiation and in this case, in particular, by ion irradiation of the applied solid electrolyte layer 230. Advantageous ion irradiation doses in this case lie above $10^{14}/cm^2$, more preferably above $10^{15}/cm^2$, in which case the ions used may be either active ions such as boron, arsenic, oxygen and phosphorus or else passive ions such as nitrogen, and noble gases, e.g., helium, neon, argon, xenon or krypton. The irradiation with the high-energy particles, in particular ions, produces impact cascades in the solid electrolyte material which anneal again within a few picoseconds. This leaves a solid electrolyte matrix having a high defect density of vacancies and dislocations, as a result of which a high ion mobility of more than $10^{-3}$ $cm^3/V_s$ can be achieved. Defect densities (of vacancies) are typically $10^{-8}$, that is say every $10^8$th lattice site is not occupied. These densities can be increased to up to $10^{-3}$ during irradiation. This can be demonstrated, e.g., by means of positron annihilation spectroscopy. Vacancy agglomerates as such arise as a result of ion or, e.g., neutron irradiation can be demonstrated by means of transmission electron microscopy (TEM).

In this case, the energy range of the ion radiation may lie between 1 keV and 150 keV. At energies of less than 1 keV, a sufficiently strong defect formation cascade does not take place in the matrix. At energies of greater than 150 keV, by contrast, the penetration depth of the ions is too large, so that damage can occur in the underlying electrode layer or the semiconductor substrate. In this case, the defect formation process may be supported by a simultaneous thermal treatment by means of heating or laser irradiation. In this case, the thermal treatment may be effected directly during the ion irradiation or else afterward, the temperature range lying between 350° C. and 650° C., for example. Such temperature values can be achieved by heating the structure or else by momentary pulsing by means of an RTA method or by means of an excimer laser annealing. The additional thermal treatment supports the defect formation in the solid electrolyte matrix.

As an alternative to a defect formation process after the actual solid electrolyte layer production, the defect formation process may be carried out simultaneously with the layer application. For this purpose, ion-beam-assisted deposition processes are suitable, in particular, in which defects that provide for high ion mobility are produced in the solid electrolyte matrix during the solid electrolyte material deposition. The process implementation during in situ defect production with regard to the ion irradiation, the ions used, the doses and energy values used, may in this case be designed in accordance with the process implementation for the after-treatment of the solid electrolyte layer with ion irradiation.

Figure 2E:
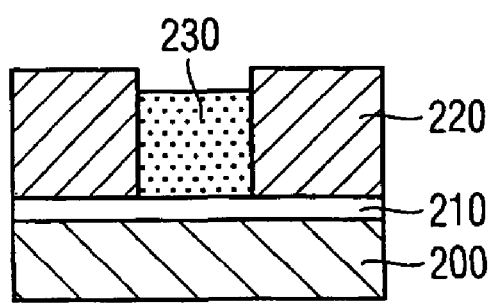
Figure 2F:
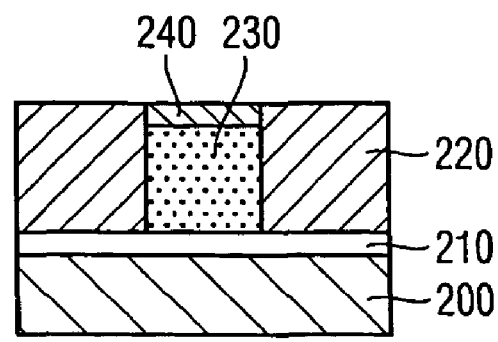

After the formation of the solid electrolyte layer 230 with targeted defect formation in the solid electrolyte matrix, the solid electrolyte 230 is then etched back somewhat in the dielectric layer 220, as is shown in FIG. 2E. Afterward, as shown in FIG. 2F, a thin metal layer 240, made of copper or silver for example, is then applied on the solid electrolyte layer. With the aid of an energetically stimulated process, e.g. by means of photodiffusion and/or thermal heating, metal ions are then driven from the metal layer 240 into the solid electrolyte 230 in order to set the electrical resistance of the solid electrolyte layer and hence of the CBRAM cell.

Figure 2G:
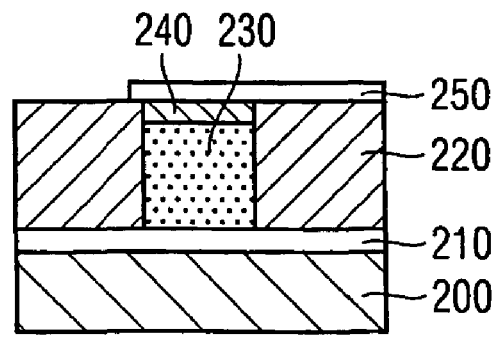

Instead of driving the metal ions into the solid electrolyte layer 230, which is porous as a result of defect formation, the metal ions may alternatively also be concomitantly introduced as early as in the context of the solid electrolyte material deposition in order thus to set the resistance of the solid electrolyte memory element. When not all of the ions have diffused into the solid electrolyte layer, the applied metal layer 240 may also be used as a second electrode layer of the solid electrolyte memory element. As an alternative, a further metal layer may be applied as a second electrode, preferably as reactive anode electrode. In this case, silver or copper is again preferably used as layer material. Finally, a metallic contact layer 250, as shown in FIG. 2G, is then applied on the second anode electrode.

One embodiment of the invention thus provides a CBRAM cell which can be produced in a manner suitable for mass production, that is to say with high reproducibility and good layer homogeneity over large areas, e.g. with the aid of the layer producing methods known from silicon planar technology, such as sputtering, CVD deposition or ALD deposition. At the same time, however, by means of targeted defect formation during the process for the fabrication of the solid electrolyte layer, a high defect density in the matrix and thus high layer porosity are achieved, which entails a high ion mobility in the solid electrolyte material and thus a high switching speed of the CBRAM cell.

In accordance with one embodiment, the defect formation in the solid electrolyte matrix is either brought about during the coating operation by means of an incorporated defect formation process or is carried out after the actual deposition operation by means of an additional defect formation process. With this procedure, a solid electrolyte layer having outstanding ion mobility values in conjunction with high layer quality can be produced in a simple manner in the context of the process implementation known from silicon technology.

Furthermore, the defect formation process of the solid electrolyte matrix can be achieved by particle irradiation, for example, by ion irradiation. The irradiation with high-energy ions produces impact cascades in the solid electrolyte matrix which anneal within a few picoseconds, but leave a high defect density in the solid electrolyte material, thus resulting in maximum mobility values for ions in the solid electrolyte material and hence CBRAM cells having short switching times for low electrical pulse heights. In the case of CBRAM cells whose solid electrolyte layer has ion-induced defects, it is possible to achieve switching speeds for the writing and erasure operations in the nanoseconds range. In this case, advantageous ion irradiation doses lie above $10^{14}/cm^2$, even more preferably above $10^{15}/cm^2$, it being possible to use either active ions such as boron, arsenic or phosphorus or else passive ions such as nitrogen, oxygen or noble gases. In this case, the advantageous energy values lie between 1 keV and 150 keV in order to limit the penetration depth of the ions and at the same time to achieve an impact cascade process. Solid electrolyte layers having maximum porosity and thus maximum ion mobility can be obtained by virtue of such optimized ion irradiation.

Furthermore, the defect formation process may be assisted by a thermal or laser treatment step, as a result of which it is possible to obtain amorphous or nanocrystalline structures in the solid electrolyte matrix with high defect density and thus improved ion mobility.

Moreover, a driving-in of metal ions into the solid electrolyte layer may be carried out after the coating operation of the first electrode with the solid electrolyte layer with targeted defect formation in the solid electrolyte matrix. With this procedure, the defect density, the solubility of the metal ions and the microstructure of the solid electrolyte layer can be established highly precisely and reproducibly.

In order to achieve fabrication of the CBRAM cell with the solid electrolyte layer that is suitable for mass production, the solid electrolyte layer may be applied on the first electrode with the aid of a sputtering process, a CVD process or an ALD process. Use of these coating methods known from silicon technology affords the possibility of using tried and tested methods known from standard memory technology also for the fabrication of CBRAM cells.

While the foregoing is directed to embodiments of the present invention, other and further embodiments of the invention may be devised without departing from the basic scope thereof, and the scope thereof is determined by the claims that follow.

What is claimed is:

1. A method for fabricating a solid electrolyte memory element, comprising:
providing a first electrode;
coating the first electrode with a solid electrolyte layer comprising a solid electrolyte matrix having a targeted defect formation in the solid electrolyte matrix, the targeted defect formation having been intentionally formed by a controlled defect formation process, wherein the targeted defect formation in the solid electrolyte matrix is effected by ion irradiation, and wherein the ion irradiation is effected with a dose of more than $10^{14}/cm^2$; and applying a second electrode on the solid electrolyte layer, wherein metal ions are driven into the solid electrolyte layer after the controlled defect formation process to form the targeted defect formation in the solid electrolyte matrix of the solid electrolyte layer.

2. The method of claim 1, wherein the ion irradiation is effected with a dose of more than $10^{15}/cm^2$.

3. The method of claim 1, wherein one or more active ions selected from boron, arsenic, oxygen and phosphorus are used for the ion irradiation.

4. The method of claim 1, wherein one or more passive ions selected from nitrogen and noble gases are used for the ion irradiation.

5. The method of claim 1, wherein the ion irradiation is carried out at energy values of between about 1 keV and about 150 keV.

6. A method for fabricating a solid electrolyte memory element, comprising:
providing a first electrode;
coating the first electrode with a solid electrolyte layer comprising a solid electrolyte matrix having a targeted defect formation in the solid electrolyte matrix, the targeted defect formation having been intentionally formed by a controlled defect formation process; and
applying a second electrode on the solid electrolyte layer, wherein the targeted defect formation in the solid electrolyte matrix is effected by particle irradiation, the particle irradiation bringing about a vacancy concentration in the solid electrolyte matrix of greater than about $10^{-8}$.

7. A method for fabricating a solid electrolyte memory element, comprising:
providing a first electrode;
coating the first electrode with a solid electrolyte layer comprising a solid electrolyte matrix having a targeted defect formation in the solid electrolyte matrix, the targeted defect formation having been intentionally formed by a controlled defect formation process; and
applying a second electrode on the solid electrolyte layer, wherein the targeted defect formation in the solid electrolyte matrix is effected by particle irradiation, the particle irradiation producing a porous microstructure with vacancy agglomerates in the solid electrolyte layer having a diameter of at least 1 nm.

8. A method for fabricating a solid electrolyte memory element, comprising:
providing a first electrode;
coating the first electrode with a solid electrolyte layer comprising a solid electrolyte matrix having a targeted defect formation in the solid electrolyte matrix, the targeted defect formation having been intentionally formed by a controlled defect formation process, wherein the targeted defect formation in the solid electrolyte matrix is brought about during the coating operation by means of an additional defect formation process;
performing a laser treatment after coating the first electrode with the solid electrolyte layer with targeted defect formation in the solid electrolyte matrix; and
applying a second electrode on the solid electrolyte layer, wherein metal ions are driven into the solid electrolyte layer after the controlled defect formation process to form the targeted defect formation in the solid electrolyte matrix of the solid electrolyte layer.

9. A method for fabricating a solid electrolyte memory element, comprising:
providing a first electrode;
coating the first electrode with a solid electrolyte layer comprising a solid electrolyte matrix having a targeted defect formation in the solid electrolyte matrix, the targeted defect formation having been intentionally formed by a controlled defect formation process, wherein the targeted defect formation in the solid electrolyte matrix is brought about during the coating operation by means of an additional defect formation process;
performing a laser treatment during the step of coating the first electrode with the solid electrolyte layer with targeted defect formation in the solid electrolyte matrix; and
applying a second electrode on the solid electrolyte layer, wherein metal ions are driven into the solid electrolyte layer after the controlled defect formation process to form the targeted defect formation in the solid electrolyte matrix of the solid electrolyte layer.

10. The method of claim 1, further comprising:
driving-in metal ions into the solid electrolyte layer after coating the first electrode with the solid electrolyte layer with targeted defect formation in the solid electrolyte matrix.

11. A solid electrolyte memory element, comprising:
an inert cathode electrode;
a reactive anode electrode; and
a solid electrolyte layer disposed between the inert cathode electrode and the reactive anode electrode, wherein the solid electrolyte layer comprises a solid electrolyte matrix having defect sites intentionally formed by a controlled defect formation process, wherein a vacancy concentration in the solid electrolyte layer is greater than about $10^{-8}$.

12. The solid electrolyte memory element of claim 11, wherein the solid electrolyte layer comprises a chalcogenide-containing compound.

13. The solid electrolyte memory element of claim 11, wherein the solid electrolyte layer comprises an oxide.

14. The solid electrolyte memory element of claim 11, wherein the reactive anode electrode comprises Cu.

15. The solid electrolyte memory element of claim 11, wherein the reactive anode electrode comprises Ag.

16. The solid electrolyte memory element of claim 11, wherein the solid electrolyte layer comprises an at least partly crystalline solid electrolyte matrix with defect sites intentionally formed by the controlled defect formation process.

* * * * *